(12) United States Patent
Kim et al.

(10) Patent No.: US 9,231,052 B2
(45) Date of Patent: Jan. 5, 2016

(54) TRANSISTOR USING SINGLE CRYSTAL SILICON NANOWIRE AND METHOD FOR MANUFACTURING SAME

(75) Inventors: Sangsig Kim, Seoul (KR); Myeong-Won Lee, Seoul (KR); Youngin Jeon, Gyeonggi-do (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

(21) Appl. No.: 14/370,212

(22) PCT Filed: Jan. 4, 2012

(86) PCT No.: PCT/KR2012/000079
§ 371 (c)(1),
(2), (4) Date: Jul. 1, 2014

(87) PCT Pub. No.: WO2013/103163
PCT Pub. Date: Jul. 11, 2013

(65) Prior Publication Data
US 2014/0353591 A1    Dec. 4, 2014

(30) Foreign Application Priority Data
Jan. 3, 2012 (KR) .................. 10-2012-0000341

(51) Int. Cl.
*H01L 29/06* (2006.01)
*H01L 21/82* (2006.01)
(Continued)

(52) U.S. Cl.
CPC ............. *H01L 29/0673* (2013.01); *B82Y 10/00* (2013.01); *B82Y 40/00* (2013.01);
(Continued)

(58) Field of Classification Search
CPC ............ H01L 29/0673; H01L 29/1033; H01L 29/517; H01L 29/775; H01L 29/42392; H01L 29/78696; H01L 21/0217; H01L 21/02164; H01L 21/02532; H01L 21/02598
USPC .................... 257/9, 24, 27, 29, 415, E27.005, 257/E21.409, E21.703, E29.081, E29.245, 257/E29.322; 438/128, 129, 184, 197, 287
See application file for complete search history.

(56) References Cited

U.S. PATENT DOCUMENTS

| 6,897,098 B2 * | 5/2005 | Hareland et al. .............. 438/128 |
| 8,013,324 B2 * | 9/2011 | Chidambarrao et al. ....... 257/24 |
| 2011/0095267 A1 * | 4/2011 | Bryant et al. ................... 257/24 |

FOREIGN PATENT DOCUMENTS

| KR | 10-2008-0018559 | 2/2008 |
| KR | 10-2010-0038437 | 4/2010 |

OTHER PUBLICATIONS

International Search Report for International Application No. PCT/KR2012/000079, dated Jan. 30, 2013.

*Primary Examiner* — Dao H Nguyen
(74) *Attorney, Agent, or Firm* — Kile Park Reed & Houtteman PLLC (57) ABSTRACT

A transistor using a single crystal silicon nanowire and a method for fabricating the transistor is disclosed. The transistor using a single crystal silicon nanowire comprises a substrate and a single crystal silicon nanowire formed on the substrate. Here, the single crystal silicon nanowire comprises a source region and a drain region formed longitudinally with the single crystal silicon nanowire and separate from each other, and a channel region located between the source region and the drain region, wherein the perpendicular thickness of the channel region to the longitudinal direction is thinner than the thickness of the source region and the drain region.

3 Claims, 5 Drawing Sheets

(51) Int. Cl.
*H01L 27/12* (2006.01)
*H01L 29/423* (2006.01)
*H01L 29/786* (2006.01)
*H01L 21/02* (2006.01)
*H01L 21/306* (2006.01)
*H01L 29/10* (2006.01)
*H01L 29/51* (2006.01)
*H01L 29/66* (2006.01)
*B82Y 10/00* (2011.01)
*B82Y 40/00* (2011.01)
*H01L 29/775* (2006.01)
*H01L 29/16* (2006.01)

(52) U.S. Cl.
CPC ...... *H01L21/0217* (2013.01); *H01L 21/02164* (2013.01); *H01L 21/02532* (2013.01); *H01L 21/02598* (2013.01); *H01L 21/30608* (2013.01); *H01L 29/1033* (2013.01); *H01L 29/42392* (2013.01); *H01L 29/517* (2013.01); *H01L 29/66439* (2013.01); *H01L 29/66568* (2013.01); *H01L 29/775* (2013.01); *H01L 29/78696* (2013.01); *H01L 29/16* (2013.01)

TRANSISTOR USING SINGLE CRYSTAL SILICON NANOWIRE AND METHOD FOR MANUFACTURING SAME

TECHNICAL FIELD

The present invention relates to a semiconductor device and a method for fabricating the same, and more particularly, a transistor using nanowire and a method for fabricating the transistor.

BACKGROUND ART

With respect to prior bottom-up methods for fabricating nanowires, there has been much progress in research in synthesizing nanowires, and its electrical, optical and physical characteristics, but there are still limitations in applying the methods for aligning this in desired locations in integrated systems.

On the contrary, overcoming problems with respect to alignments are possible when fabricating nanowires in a top-down method, but they are fabricated through SOI substrates and e-beam lithography and thus have problems in productivity of nanowire devices.

Recently, various methods regarding fabricating nanowires using single crystal silicon substrates, not SOI substrates, are being introduced, but devices using these are realized on rigid substrates or even when realized on flexible substrates, they mostly have bottom-gate and top-gate structures.

But the nanowires, as its diameter becomes smaller, electrostatic control effects of nanowire devices become excellent, but have problems of parasitic resistance of source/drain becoming greater.

Also, as the size of devices become smaller, channel lengths of transistors formed at device forming regions, especially active regions becoming shorter, and thus influence of source/drain regions to electric fields of channel regions become significant, and problems of short channel effects, from which channel driving performance by gate electrodes deteriorates, occur.

DISCLOSURE

Technical Problem

The present invention is devised to solve the prior problems described above, and the objective is to provide a transistor device using a nanowire having a small source/drain parasitic resistance and excellent electrostatic control effects, and a method for fabricating the transistor.

Also, the objective is to provide a transistor device using nanowires having micro-sizes and also a structure that may overcome single channel effects, and a method for fabricating the transistor.

Technical Solution

To achieve the objective, a transistor using a single crystal silicon nanowire in accordance with the present invention comprises a substrate and a single crystal silicon nanowire formed on the substrate. Here, the single crystal silicon nanowire comprises a source region and a drain region formed longitudinally with the single crystal silicon nanowire and separate from each other, and a channel region located between the source region and the drain region, wherein perpendicular thicknesses of the channel region to the longitudinal direction is thinner than a thickness of the source region and the drain region.

Likewise, by realizing the diameter of the single crystal silicon nanowire channel region used as the channel of the transistor to be smaller than the region of the source region and the drain region, a transistor using a nanowire having a small source/drain parasitic resistance and excellent electrostatic control effects may be fabricated.

Also, the transistor using the single crystal silicon nanowire may further comprise a gate electrode encompassing the channel region, and a high-k gate insulation film between the single crystal silicon nanowire channel region and the gate electrode.

Likewise, by configuring the gate electrode of the transistor using the single crystal silicon nanowire in a gate all around (GAA) type, a transistor device using the nanowire having a structure that may have micro-sizes and overcome single channel effects may be fabricated.

Also, the substrate of the transistor using the single crystal silicon nanowire may be a flexible substrate.

Also, a method for fabricating the transistor using the single crystal silicon nanowire comprises steps of forming a single crystal silicon nanowire from a single crystal silicon substrate, and transferring the formed single crystal silicon nanowire to a transistor substrate.

Here, the forming a single crystal silicon nanowire step comprises, a device region forming step forming each source region and drain region separated from each other in a longitudinal direction of the single crystal silicon nanowire in a pre-set region of the single crystal silicon nanowire, and a channel region located between the source region and the drain region, and a channel region thickness reduction step forming longitudinal and perpendicular thicknesses of the channel region thinner than the source region and the drain region.

Also, the method for fabrication the transistor using the single crystal silicon nanowire may further comprise forming a gate electrode encompassing the channel region, and forming a high-k gate insulation film between the single crystal silicon nanowire channel region and the gate electrode.

Also, the device region forming step comprises implanting impurities for forming the channel region, the source and the drain region, and the channel region thickness reduction step may comprise reducing the thickness of the channel region by using anisotropic etching in accordance with a concentration difference of impurities between impurities concentration of the channel region and impurities concentration of the source and the drain region.

Also, the forming the single crystal silicon nanowire step may comprise, forming a silicon oxide film on a single crystal silicon substrate, forming a silicon nitride film on the silicon oxide film, forming a nanowire active pattern by etching the silicon nitride film and the oxide film, forming a silicon column structure by etching the silicon substrate with the silicon nitride film as a mask, forming a silicon structure in a hourglass shape by using anisotropic etching the silicon column structure in accordance with a crystal structure, exposing the channel region of the nanowire on the silicon structure, oxidizing the hourglass shaped silicon structure with the channel region exposed, removing the silicon nitride film, and removing the oxide film from the silicon structure.

Also, the forming the single crystal silicon nanowire step may comprise, forming a silicon oxide film on a single crystal silicon substrate, forming a silicon nitride film on the silicon oxide film, forming a nanowire active pattern by etching the silicon nitride film and the oxide film, forming a silicon column structure by etching the silicon substrate with the silicon nitride film as a mask, forming a silicon structure in a hourglass shape by using anisotropic etching the silicon column structure in accordance with a crystal structure, oxidizing the hourglass shaped silicon structure, exposing the channel region of the nanowire on the silicon structure, removing the exposed channel region in a pre-set depth, removing the silicon nitride film, and removing the oxide film from the silicon structure.

Also, the anisotropic etching may be performed by using tetramethyl ammonium hydroxide (TMAH), which is an anisotropic etching solution.

Also, the single crystal silicon may be oxidized by a thermal oxidization method.

Also, forming a thermal oxidization film on the single crystal silicon substrate step may be further comprised after removing the silicon nitride film and the oxide film.

Advantageous Effects

According to the present invention, by realizing the diameter of the single crystal silicon nanowire channel region used as the channel of the transistor to be smaller than the adjacent source region and the drain region, a transistor using a nanowire having a small source and drain parasitic resistance and excellent electrostatic control effects may be fabricated.

Also, by configuring the gate electrode of the transistor using the single crystal silicon nanowire in a gate all-around (GAA) type, a transistor device using the nanowire having a structure that may have micro-sizes and overcome single channel effects may be fabricated.

BEST MODE

Hereinafter, preferred embodiments of the present invention are described with reference to accompanying drawings.

Figure 1:
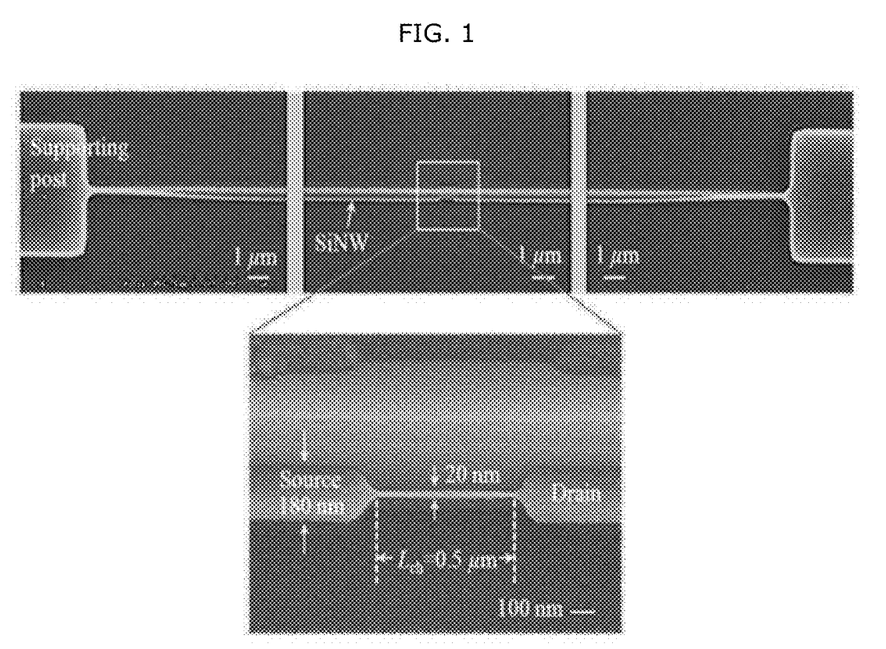
FIG. 1 is a SEM picture of a fabricated nanowire in accordance with a method for fabricating a transistor using a single crystal silicon nanowire in accordance with the present invention.

FIG. 1 is a SEM picture of a fabricated nanowire in accordance with a method for fabricating a transistor using a single crystal silicon nanowire in accordance with an embodiment of the present invention. The nanowire fabricated in FIG. 1 is supported by a supporting pad, and the diameter of a channel region formed smaller than an adjacent source region and a drain region.

Likewise, by realizing the diameter of the single crystal silicon nanowire channel region used as the channel of the transistor to be smaller than the adjacent source region and the drain region, a transistor using a nanowire having a small source and drain parasitic resistance and excellent electrostatic control effects may be fabricated.

Also, the transistor using the single crystal silicon nanowire may further comprise a gate electrode encompassing the channel region, and a high-k (high permittivity) gate insulation film between the single crystal silicon nanowire channel region and the gate electrode.

Likewise, by configuring the gate electrode of the transistor using the single crystal silicon nanowire in a gate all around (GAA) type, a transistor device using the nanowire having a structure that may have micro-sizes and overcome single channel effects may be fabricated.

Hereinafter, the present invention is described in more detail with detailed embodiments.

First Embodiment

Figure 2:
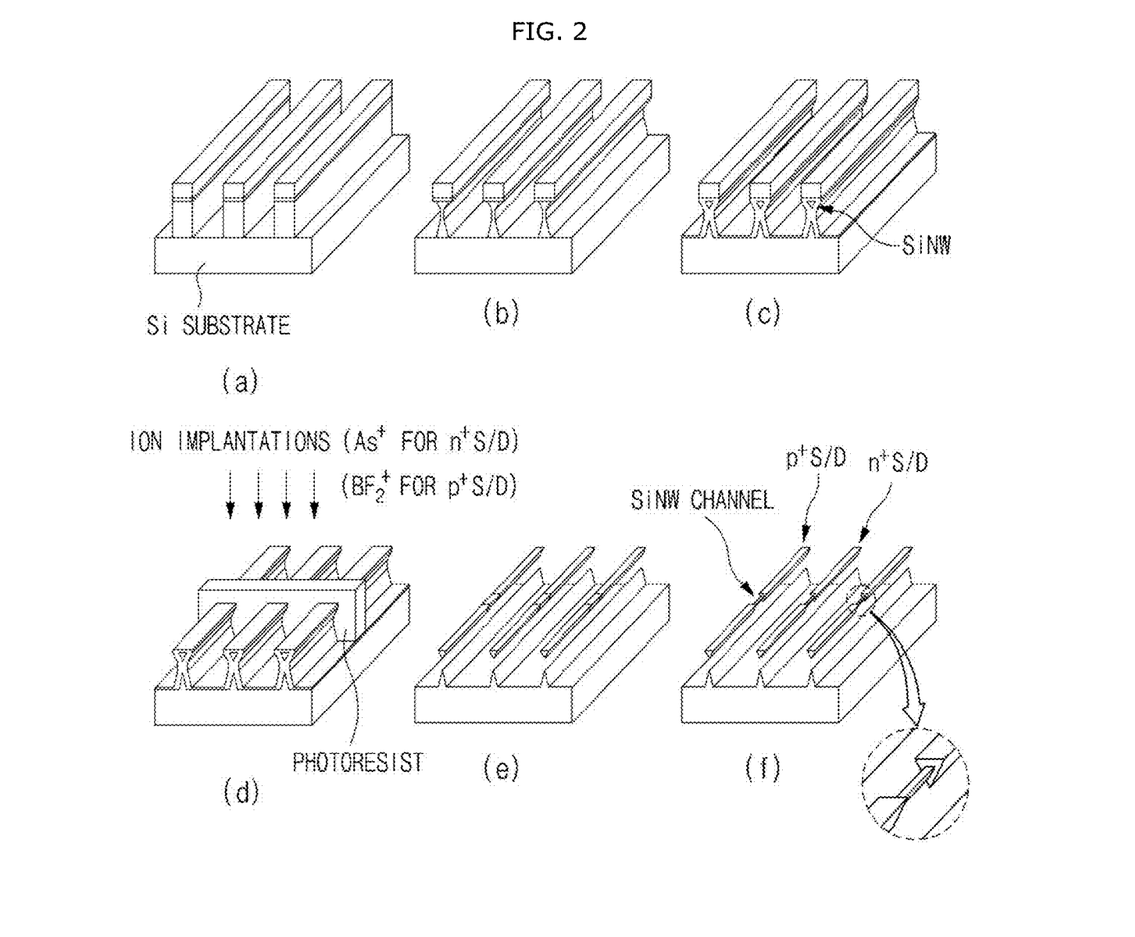
FIG. 2 is process chart of fabricating a single crystal silicon nanowire in accordance with a first embodiment of the present invention.

FIG. 2 is a process chart of fabricating a single crystal silicon nanowire in accordance with a first embodiment of the present invention.

In FIG. 2, a method for fabricating a single crystal silicon nanowire having a thin nanowire channel diameter by using an etch rate difference of an anisotropic we etching solution in accordance with an impurity concentration difference between a source/drain region in which high concentration impurities are implanted and a channel region in which low concentration impurities are implanted is illustrated.

First, after depositing a first thermal oxide film and a silicon nitride film on a single crystal silicon substrate having a crystal structure of (100), a silicon nanowire active pattern is formed through a photo process. And then, a silicon column structure is formed by an isotropic etching the silicon substrate through a silicon dry etching process by using the silicon nitride film as a mask (FIG. 2a).

And then, an hourglass shaped silicon structure is formed when the silicon column structure is we etched by using tetramethyl ammonium hydroxide (TMAH), which is an anisotropic etching solution (FIG. 2b). Likewise, because the we etch rate of the anisotropic etching solution with respect to the crystal structure of (111) is much slower than the we etch rate with respect to the crystal structure of (100) or (110), the crystal structure (111) may act as a etch preventing layer and thus a silicon structure in an hourglass shape may be formed.

And then, a silicon nanowire in a triangular shape is formed through growing a second thermal oxide film by thermal oxidizing the silicon structure in an hourglass shape (FIG. 2c). And then, the silicon nitride film is removed and the source/drain region of the nanowire is defined through photo process, and then impurities are implanted through an ion implantation process (FIG. 2d).

Here, after the removal of the silicon nitride film and before the implantation of the impurities, the first thermal oxide film may be removed from the single crystal silicon substrate and a third thermal oxide film may be formed again. In this case, the third oxide film in a good condition may be formed on the single crystal silicon substrate instead of the first thermal oxide film damaged during the removal of the silicon nitride film.

And then, a photoresist is removed and a thermal treatment is performed to activate the impurities. And then, the first thermal oxide film and the second thermal oxide film are removed and a silicon nanowire released from the substrate is formed (FIG. 2e).

Lastly, the single crystal silicon nanowire having a channel diameter in the level of several nm or several tens of nm is formed while maintaining the silicon nanowire diameter of the source/drain region, in which high concentration impurities are implanted, by we etching the silicon nanowire by using tetramethyl ammonium hydroxide (TMAH), which is an anisotropic etching solution (FIG. 2f).

Second Embodiment

Figure 3:
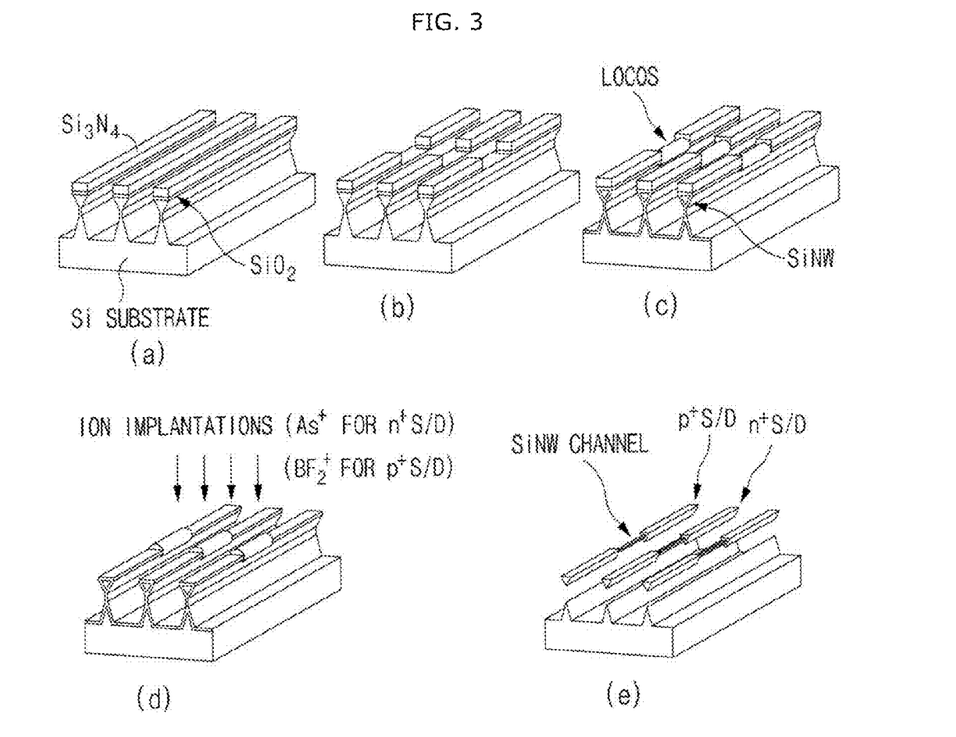
FIG. 3 is process chart of fabricating a single crystal silicon nanowire in accordance with a second embodiment of the present invention.

FIG. 3 is process chart of fabricating a single crystal silicon nanowire in accordance with a second embodiment of the present invention.

As illustrated in FIG. 3, in the method for fabricating the silicon nanowire having a thin channel diameter using the single crystal silicon substrate in accordance with a second embodiment of the present invention, by decreasing the diameter of the silicon nanowire channel region by growing the thermal oxide film after exposing the channel region of the nanowire, a single crystal silicon nanowire having a channel diameter in the level of several nm or several tens of nm is fabricated while maintaining the silicon nanowire diameter of the source/drain region, in which high concentration impurities are to be implanted, thick.

Here, since a portion of the process of the second embodiment is identical to FIG. 2a to FIG. 2b, hereinafter, the process for reducing the diameter of the silicon nanowire channel region is described in detail.

After forming the silicon structure in a hourglass shape through the process of FIG. 2a to FIG. 2b (FIG. 3a), the channel region of the nanowire is exposed through a photo etching process (FIG. 3b). And then, when the second thermal oxide film is formed by thermal oxidizing the silicon nanowire, the oxide film grows only on the side surface of the silicon nanowire of the source/drain region below the silicon nitride film, whereas, the oxide film grows not only on the side surface but also on the top surface of the silicon nanowire of the channel region, thus a silicon nanowire having a thinner channel than the source/drain may be formed (FIG. 3c).

And then, the silicon nitride film is removed and after source/drain region of the nanowire is defined through a photo process, the impurities are implanted through an ion implantation process (FIG. 3d). Here, as in the first embodiment, after the removal of the silicon nitride film and before the implantation of the impurities, the first thermal oxide film may be removed from the single crystal silicon substrate and a third thermal oxide film may be formed again.

And then, the photoresist is removed and a thermal treatment is performed to activate the impurities. Lastly, when the first thermal oxide film and the second thermal oxide film are removed, a silicon nanowire having a thin channel region released from the substrate may be formed (FIG. 3e).

Third Embodiment

Figure 4:
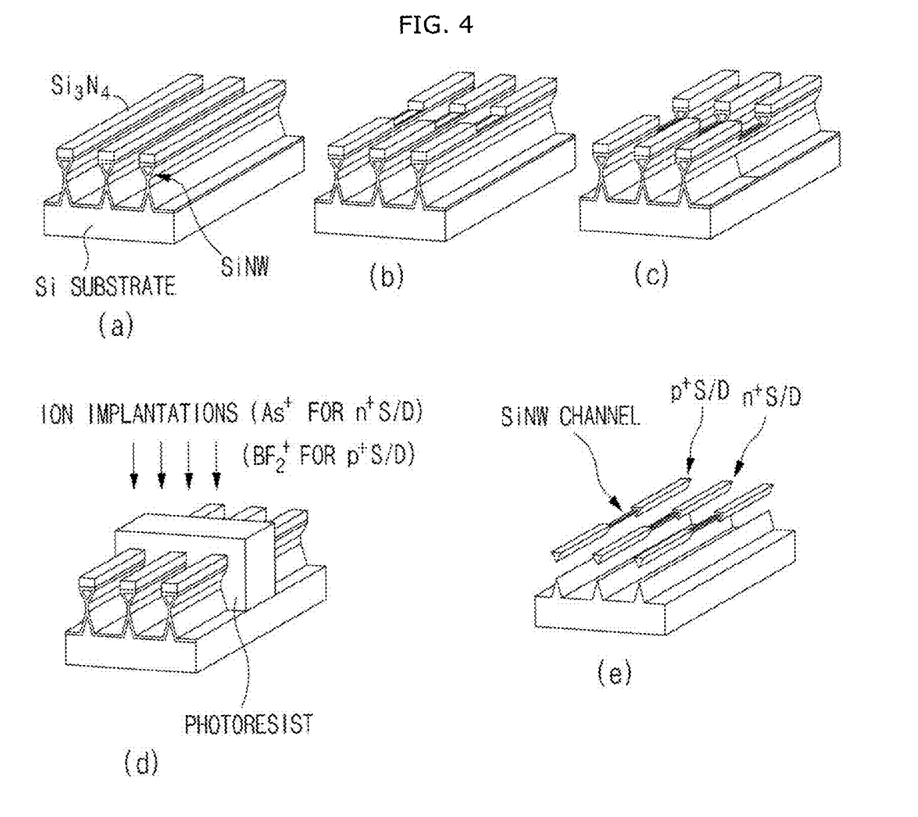
FIG. 4 is process chart of fabricating a single crystal silicon nanowire in accordance with a third embodiment of the present invention.

FIG. 4 is process chart of fabricating a single crystal silicon nanowire in accordance with a third embodiment of the present invention.

As illustrate in FIG. 4, in the method for fabricating the silicon nanowire having a thin channel diameter using the single crystal silicon substrate in accordance with a third embodiment of the present invention, by decreasing the diameter of the silicon nanowire channel region through a silicon dry etching by exposing only the channel region of the nanowire, a single crystal silicon nanowire having a channel diameter in the level of several nm or several tens of nm is fabricated while maintaining the silicon nanowire diameter of the source/drain region, in which high concentration impurities are to be implanted, thick.

Here, since a portion of the process of the third embodiment is identical to FIG. 2a to FIG. 2c, hereinafter, the process for reducing the diameter of the silicon nanowire channel region is described in detail.

After forming the silicon structure in a triangular shape through the process of FIG. 2a to FIG. 2c (FIG. 4a), the channel region of the nanowire is exposed through a photo etching process (FIG. 4b).

And then, a silicon nanowire having a thinner channel than the source/drain is formed through a silicon nanowire dry etching (FIG. 4c). Here, since the silicon nitride film is used as a dry etching preventing film, the silicon nanowire of the source/drain region is not influenced from the dry etching.

And then, the silicon nitride film is removed and after the source/drain region of the nanowire is defined through a photo process, the impurities are implanted through an ion implantation process (FIG. 4d). Here, as in the first and the second embodiment, after the removal of the silicon nitride film and before the implantation of the impurities, the first thermal oxide film may be removed from the single crystal silicon substrate and a third thermal oxide film may be formed again.

And then, the photoresist is removed and a thermal treatment is performed to activate the impurities. Lastly, when the first thermal oxide film and the second thermal oxide film are removed, a silicon nanowire having a thin channel region released from the substrate may be formed (FIG. 4e).

Fourth Embodiment

Figure 5:
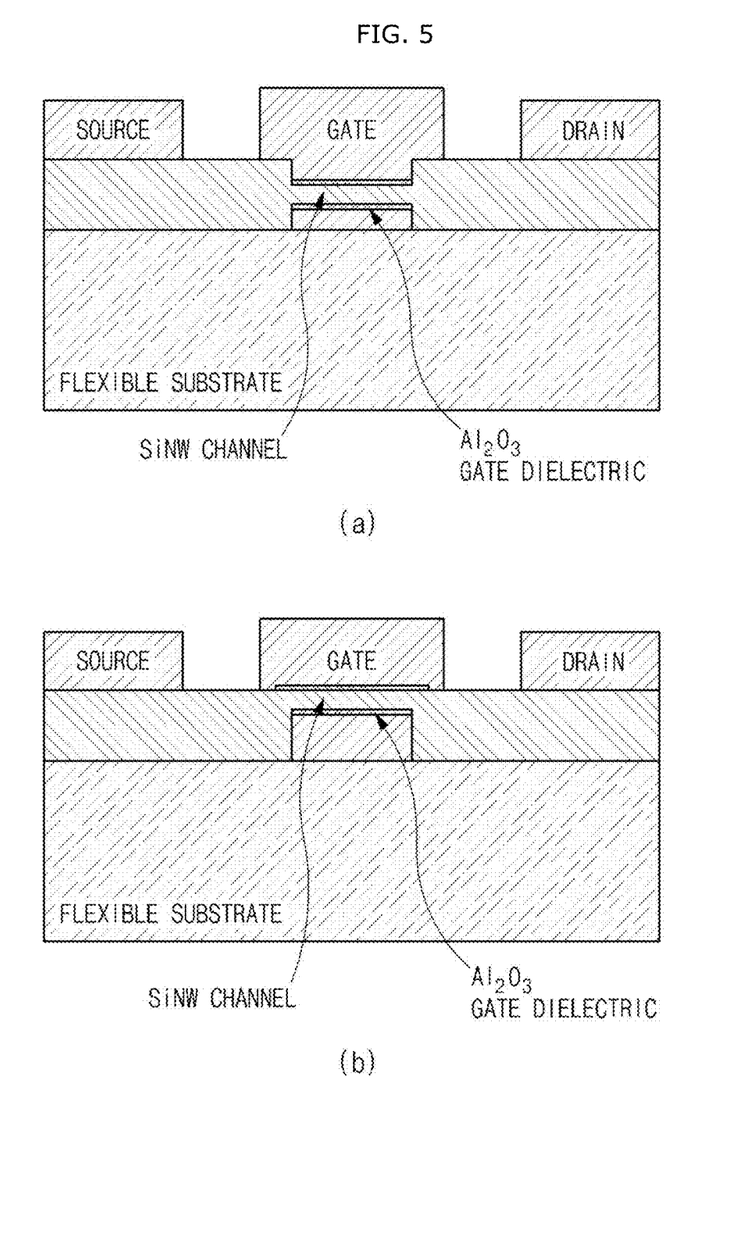
FIG. 5 is a process chart of fabricating a device using a single crystal silicon nanowire in accordance with a first embodiment to a third embodiment.

FIG. 5 is a process chart of fabricating a device using a single crystal silicon nanowire in accordance with a first embodiment to a third embodiment.

As illustrated in FIG. 5, in the fourth embodiment of the present invention, a flexible all-around gate transistor is fabricated by using the nanowire fabricated by applying the methods of the first embodiment to the third embodiment.

By using the silicon nanowire having a thin channel diameter formed by methods of the first embodiment to the third embodiment of the present invention, as illustrated in FIG. 5a to FIG. 5b, a transistor having an all-around gate structure may be fabricated by forming a gate insulation film and a metal electrode after transferring the silicon nanowire on a insulating flexible substrate.

Here, the insulating flexible substrate, on which the single crystal silicon nanowire having a thin channel diameter is to be transferred, comprises rubber, fiber, paper, and plastic. Meanwhile, transferring the single crystal silicon nanowire having a thin channel diameter to a different insulating substrate may be performed using polymers, etc. such as photoresist or resin having good adhesive characteristics, and after transferring, may be removed through an dry ashing using oxygen plasma and a we etching using ethanol.

In the present invention, a flexible all-around gate transistor is fabricated, after fabricating the silicon nanowire having a thin channel diameter through a prior CMOS compatible process by using the single crystal silicon substrate, by transferring this to a different flexible insulating substrate and a method for fabricating the same is provided.

Therefore, the flexible all-around gate transistor fabricated by using the method for fabricating the single crystal silicon nanowire of the present invention is excellent in controlling short channel effects and has advantages in that current driving performance is excellent because the source/drain parasitic component is small.

Also, the flexible all-around gate transistor fabricated by using the method for fabricating the single crystal silicon nanowire of the present invention has advantages of being able to improve the ON/OFF switching characteristics by controlling the tunneling probability more effectively.

Meanwhile, the present invention, by applying prior silicon process technologies, has advantages of being able to produce a nanowire device having a channel region diameter in the level of several tens of nm without using an e-beam lithography and a SOI wafer.

A method for fabricating the single crystal silicon nanowire having a thin channel diameter using the single crystal silicon substrate and a method for fabricating the flexible all-around gate transistor in accordance with the present invention fabricate the flexible all-around gate transistor by, after fabricating the single crystal silicon nanowire having a thin channel diameter in a wafer unit process by using the single crystal silicon substrate, transferring this to a different insulating substrate and through a photo process and a lift-off process of a metal electrode.

The single crystal silicon nanowire having a thin channel diameter and a method for fabricating the same in accordance with an embodiment of the present invention is able to apply public prior silicon process technologies intactly, and the single crystal silicon nanowire having a channel diameter in the level of several nm or several tens of nm is formed while maintaining the silicon nanowire diameter of the source/drain region, in which high concentration impurities are implanted, intact by using the etch rate difference of tetramethyl ammonium hydroxide (TMAH), which is an anisotropic etching solution in accordance with the impurities concentration difference.

The methods for fabricating a single crystal silicon nanowire having a thin channel diameter in accordance with another embodiment of the present invention is able to apply public prior silicon process technologies intactly, and the single crystal silicon nanowire having a channel diameter in the level of several nm or several tens of nm is formed while maintaining the silicon nanowire diameter of the source/drain region, in which high concentration impurities are implanted, intact through a local oxidation of silicon (LOCOS) process or a silicon dry etching process.

Also, the single crystal silicon nanowire having a thin channel diameter in accordance with the present invention may be applied to fabrication of various devices of all-around gate complementary field effect transistors (c-MOSFET), transistors using all-around gate complementary tunneling effects, all-around gate complementary impact-ionization field effect transistors (cI-MOS), all-around gate complementary junction-less transistors, all-around gate capacitorless 1T-DRAM devices, all-around gate non-volatile memory devices, etc.

Even though the present invention is described by preferred embodiments, the scope of the present invention is not limited thereof, and covers changes or improvements of the described embodiments from the scope of the claims.

The invention claimed is:

1. A transistor using a single crystal silicon nanowire comprising:
    a flexible substrate; and
    a single crystal silicon nanowire transferred to the flexible substrate,
    wherein the single crystal silicon nanowire comprises a source region and a drain region formed longitudinally with the single crystal silicon nanowire and separate from each other, and a channel region located between the source region and the drain region, wherein a perpendicular thickness of the channel region to a longitudinal direction is thinner than a thickness of the source region and the drain region,
    wherein the single crystal silicon nanowire has a triangular cross sectional shape in the perpendicular direction to the longitudinal direction of the single crystal nanowire, and
    wherein the triangular shape is formed by oxidizing an hourglass shaped silicon structure which is formed by anisotropic etching of a silicon column structure formed on a single crystal silicon substrate in accordance with a crystal structure.

2. A transistor using a single crystal silicon nanowire according to claim 1, further comprising a gate electrode encompassing the channel region.

3. A transistor using a single crystal silicon nanowire according to claim 2, further comprising a high-k gate insulation film between the single crystal silicon nanowire channel region and the gate electrode.

* * * * *